(12) United States Patent
Sabo et al.

(10) Patent No.: US 7,708,566 B2
(45) Date of Patent: May 4, 2010

(54) ELECTRICAL CONNECTOR WITH INTEGRATED CIRCUIT BONDED THEREON

(75) Inventors: James M. Sabo, Marysville, PA (US); Kevin E. Walker, Hershey, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 65 days.

(21) Appl. No.: 11/980,253

(22) Filed: Oct. 30, 2007

(65) Prior Publication Data
US 2009/0111332 A1 Apr. 30, 2009

(51) Int. Cl.
*H01R 12/00* (2006.01)
(52) U.S. Cl. .............. 439/79; 439/620.24; 439/181
(58) Field of Classification Search ........... 439/181, 439/620.22, 620.24, 79
See application file for complete search history.

(56) References Cited

U.S. PATENT DOCUMENTS

| | | | |
|---|---|---|---|
| 5,161,991 A | 11/1992 | Bauer | |
| 5,224,878 A | 7/1993 | Lurie et al. | |
| 6,350,152 B1 * | 2/2002 | Belopolsky et al. | 439/541.5 |
| 6,964,585 B2 * | 11/2005 | Blichasz et al. | 439/638 |
| 7,018,242 B2 * | 3/2006 | Brown et al. | 439/676 |
| 7,044,794 B2 | 5/2006 | Consoli et al. | |
| 2008/0194058 A1 * | 8/2008 | Kwon et al. | 438/108 |

OTHER PUBLICATIONS

Mouser Electronics catalog entitled "ESD/EMI Filtered USB Connectors & Patch Antenna Elements" pp. 1011 and 1064, dated 2007.

* cited by examiner

*Primary Examiner*—Tho D Ta
*Assistant Examiner*—Travis Chambers
(74) *Attorney, Agent, or Firm*—Wei Te Chung; Andrew C. Cheng; Ming Chieh Chang

(57) ABSTRACT

An electrical connector is mounted to a printed circuit board with a number of electrical circuits thereon for mating with a complementary plug. The electrical connector has a connector member and an IC bonded to connector member and combining with the connector member into a single unit. The connector member includes an insulative housing and a number of integrated electrical contacts attached thereto. The insulative housing has a mating face and a mounting face. Each electrical contact includes a retention engaging with the insulative housing, a mating section extending from one end of the retention section to the mating face, and a mounting portion extending from the other end of the retention section to the mounting face. The electrical contacts is electrically connected the printed circuit board and the IC.

9 Claims, 24 Drawing Sheets

ELECTRICAL CONNECTOR WITH INTEGRATED CIRCUIT BONDED THEREON

BACKGROUND OF THE INVENTION

1. Field of the Invention

The present invention relates generally to electrical connector, and more particularly to a connector having an integrated circuit bonded thereon.

2. Description of Related Art

Electrical connectors are typically used to couple PCB (Printed Circuit Board) which have numerous electrical devices. Some electrical connectors have a mating end wherein conductive terminals are exposed for engagement with the terminals of a mating connector. When mating the connectors, opposite charges at the connector interface may result in an ESD between the two connectors. In fact, electrostatic discharges can be generated simply by a person approaching or touching the connector interface or touching the terminal contacts. As known, when the ambient relative humidity drops to fifty percent or below, the human body accumulates a large electrical charge which can be in excess of 20,000 volts. Generally, very little current is associated with an electrostatic discharge; however, the voltage can be high enough to damage or destroy certain types of electrical devices such as semiconductor devices. Consequently, when the connector contacts or terminals are electrically associated with such devices on a circuit board, the electrostatic discharge may damage or destroy the electrical devices on the circuit board.

In order to alleviate the electrostatic discharge problem, some electrical connectors include features to provide ESD protection. In at least some connectors, ESD protection is provided with a shield in the form of a plate, bar, or the like located proximate the connector interface and connected to ground on or proximate the connector. In the same time, the circuit boards which the connectors mounted also provide ESD protection such as IC (Integrated Circuit) to prevent the damage of the ESD. Nowadays, there is a trend that computers and handset devices such as mobile phones, digital cameras, MP3, PDA are need to provide more and more functions. Accordingly, the input/output connectors of above systems are increased which can result in the ESD entering the systems and destroying the electrical devices on the circuit board more frequently. Furthermore, with the addition of characteristics and the integration of functions, the designs of the PCB and the IC mounted thereon become sensitive about the ESD. Therefore, the ESD protections disposed on the circuit board not only occupy space thereof but also increases the complexity of the circuit board.

Hence, it is desired a connector can integrate the ESD protection therein instead of the PCB.

BRIEF SUMMARY OF THE INVENTION

Accordingly, an object of the present invention is to provide an electrical connector with an IC integrated thereon for protection.

In order to obtain the object, an electrical connector is mounted to a PCB with a plurality of electrical circuits thereon and mates with a complementary plug. The electrical connector comprises a connector member and an IC bonded thereto and combining with the connector member into a single unit. The connector member comprises an insulative housing and a plurality of electrical contacts attached thereto. The insulative housing has a mating face and a mounting face. Each electrical contact includes a retention section engaging with the insulative housing, a mating section extending from one end of the retention section to the mating face, and a mounting section extending from the other end of the retention section to the mounting face. The electrical contacts is electrically connected the printed circuit board and the IC.

The IC is bonded to the connector member with a carrier-PCB. The IC is mechanically and electrically connected with the carrier-PCB and shares the electrical circuits on the PCB with the electrical contacts through the carrier-PCB. Two signal transmitting paths can be establish from the mating plug to the PCB, one of which is through the electrical contacts directly, the other is through the contacts, the carrier-PCB and the IC.

The IC also can mount to the electrical connector member directly and mechanically connected with the electrical circuits on the PCB. Two signal transmitting paths can be establish from the mating plug to the PCB, one of which is through the electrical contacts directly, the other is through the contacts and the IC.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
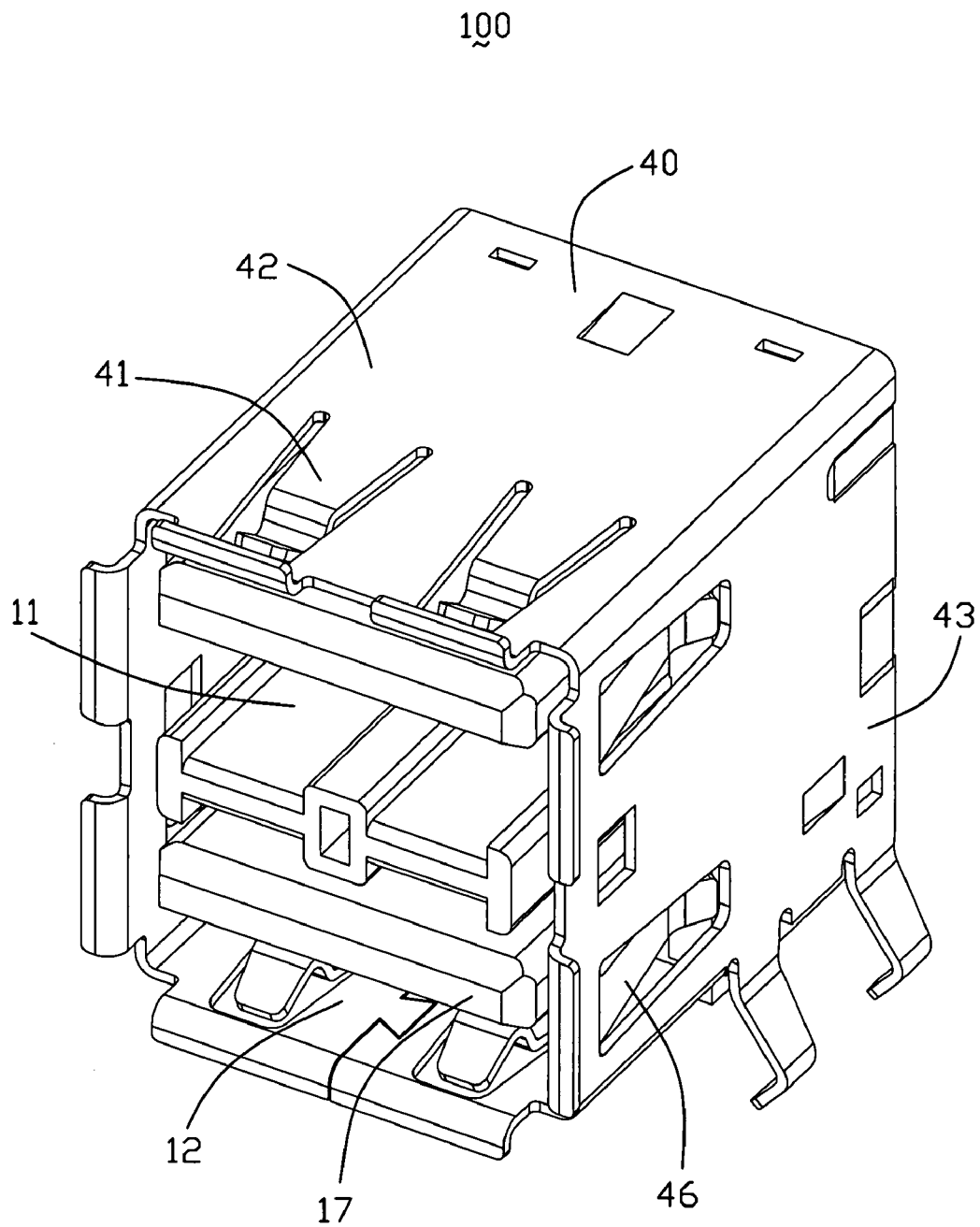
FIG. 1 is a perspective view of an electrical connector according to a first embodiment of the present invention.

Reference will be made to the drawing figures to describe the present invention in detail, wherein depicted elements are not necessarily shown to scale and wherein like of similar elements are designated by same or similar reference numeral through the several views and same or similar terminology.

Referring to FIGS. 1-6, the present invention is directed to an electrical connector system 100 mounting to a PCB or motherboard 90 having an insulative housing 10 including a plurality of receiving spaces or receptacle openings 11, 12 each adapted to receive a complementary electrical plug (not shown). The connector 100 includes a plurality of integrated electrical contacts 20 arranged in the first and second groups 21, 22 corresponding to a respective one of the receptacle openings 11, 12. The connector 100 has an outer shield 40 that generally surrounds the housing 10 and has grounding contacts 41 to create an electrical connection between the conductive outer shield 40 and the plug when inserted therein. The connector 100 also includes a sub-assembly integrated thereon.

While the drawings display a double deck USB connector system 100, the present invention could be used with any type of electrical connector. While each receptacle is shown with four contacts 20 in a group 21, 22, the invention can be employed with any desired number of contacts 20 in a group. Similarly, while two receptacles 11, 12 are shown, the invention can be employed with a single receptacle or any desired number of stacked receptacles.

Figure 2:
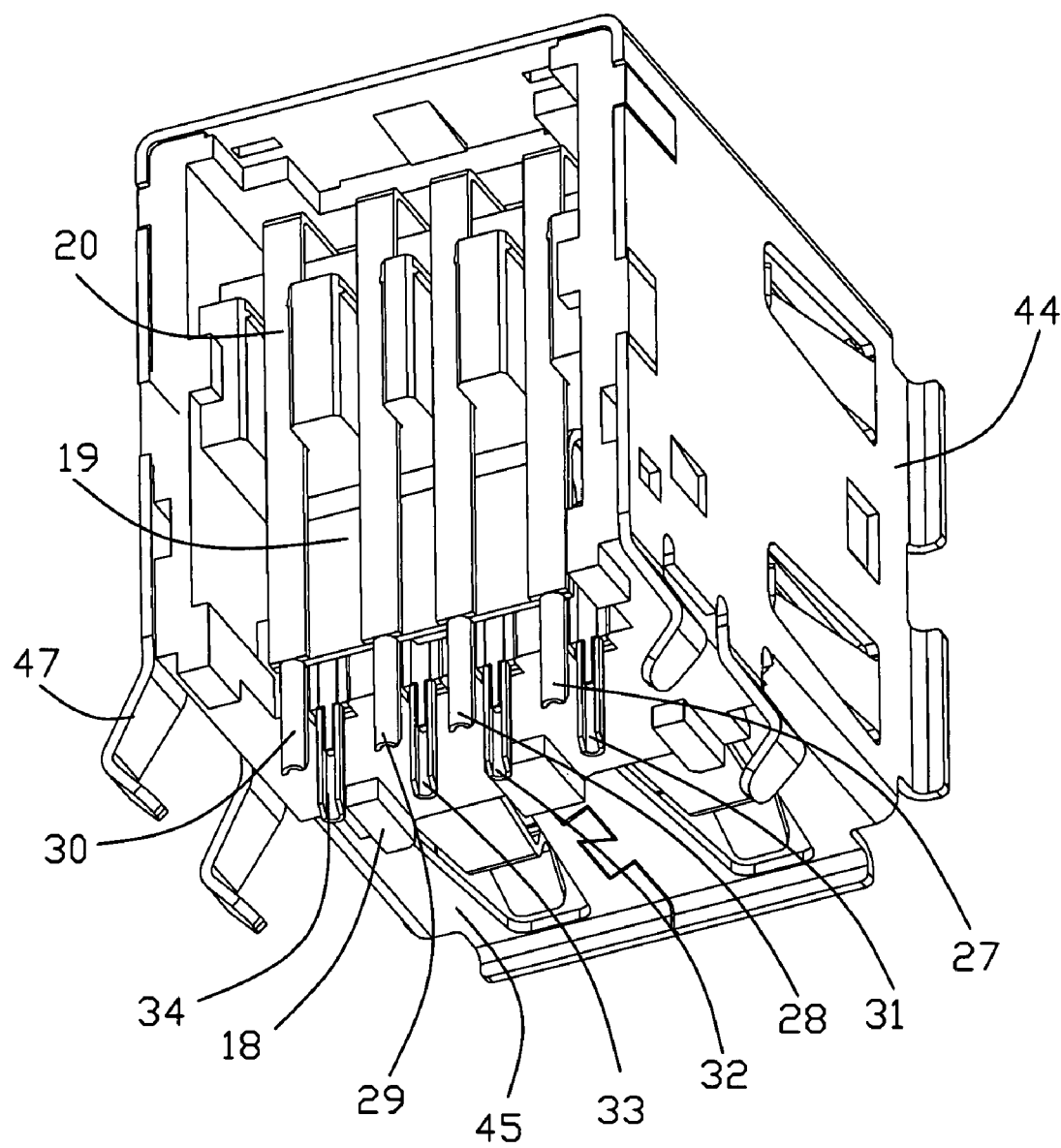
FIG. 2 is another perspective view of the electrical connector shown in FIG. 1, while taken from a different aspect.
Figure 3:
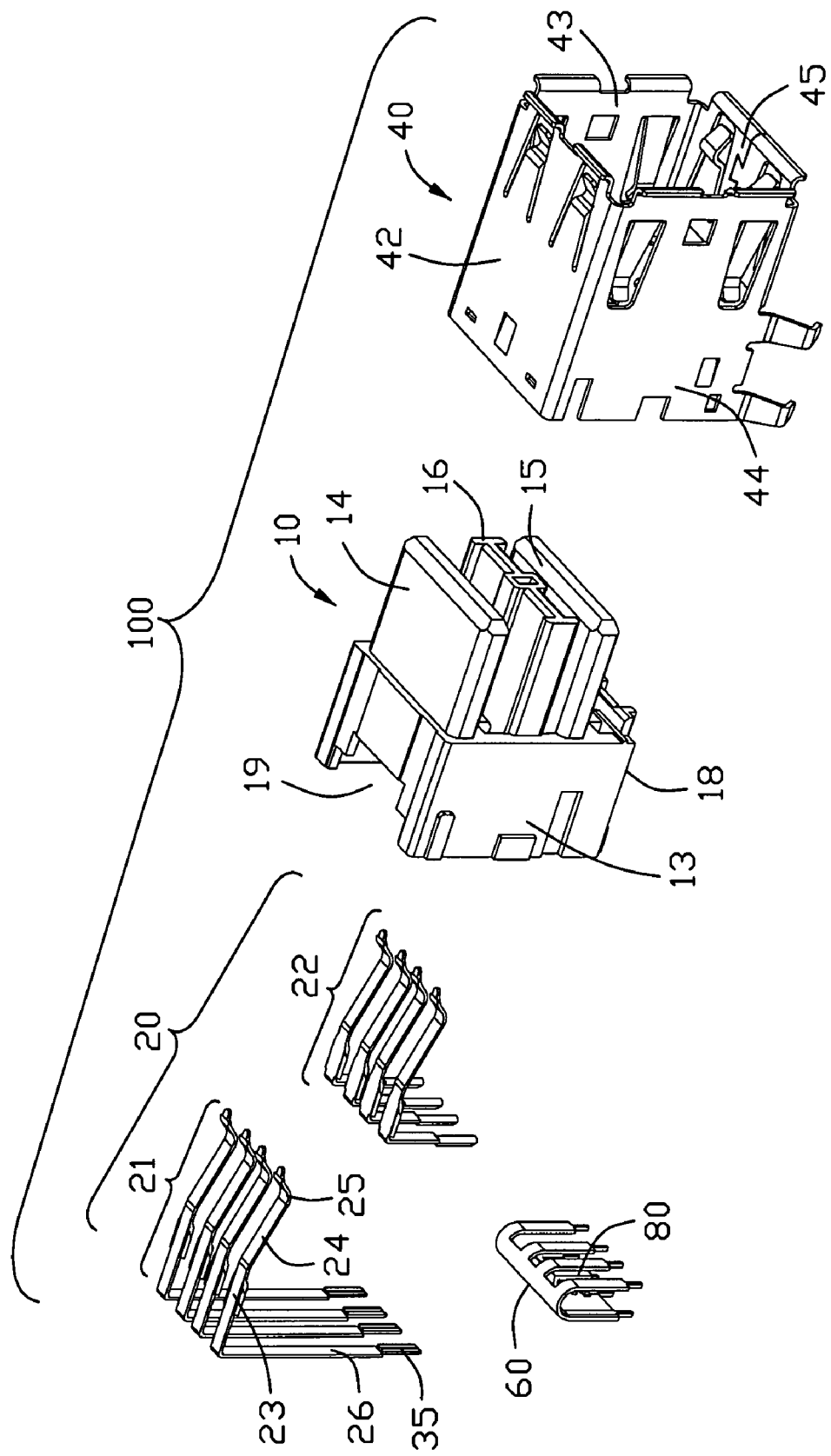
FIG. 3 is an exploded view of the electrical connector shown in FIG. 1.
Figure 6:
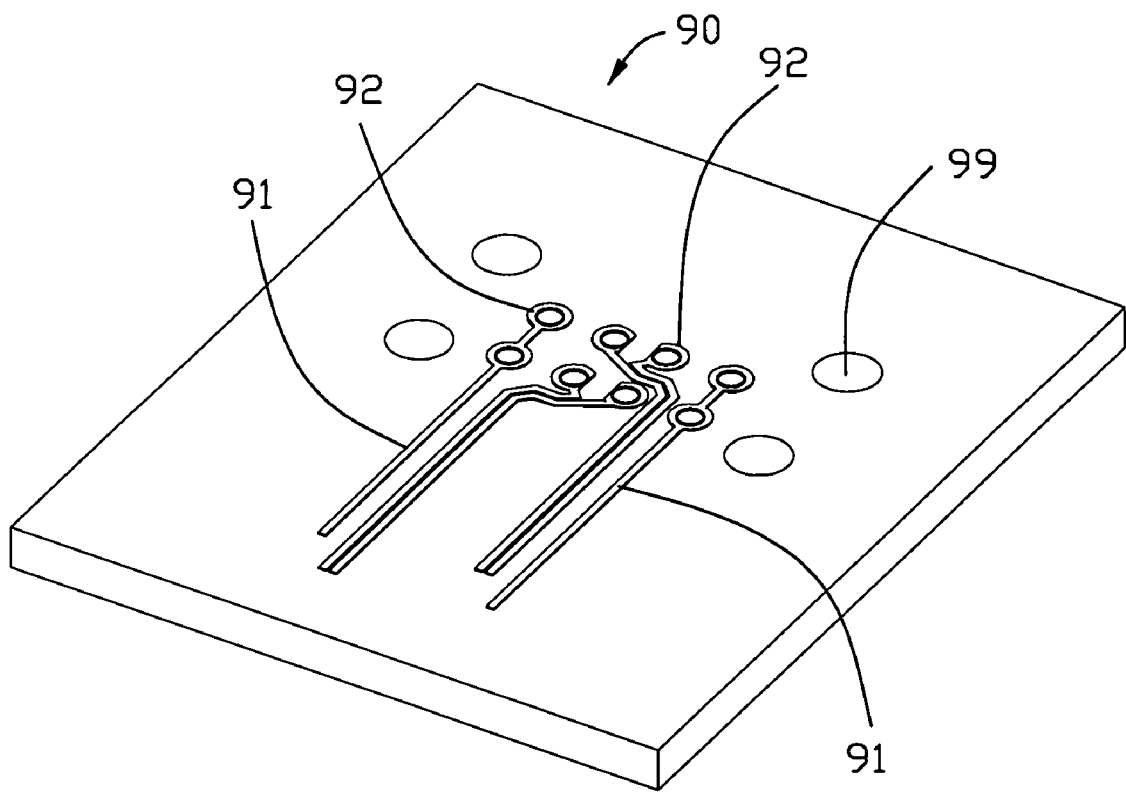
FIG. 6 is a perspective view of a PCB for the electrical connector shown in FIG. 1 mounted thereon.

Referring to FIGS. 1-3, the shield 40 is preferably stamped from a single sheet of suitable conductive material, which includes a top wall 42, opposed lateral walls 43, 44, and a bottom wall 45. The opposed lateral walls 43, 44 each have longitudinal springs 46 bent so as to extend into the receptacles 11, 12 to bear against a corresponding shield (not shown) of the plug (not shown). Board locks 47 mate with the holes 99 (as shown in FIG. 6) of the PCB 90 and aid in positioning the electrical connector 100 with respect to the PCB 90.

As illustrated in FIG. 3, the insulative housing 10 has a rear section 13 with tongues 14, 15 extending forwardly therefrom. The upper and lower tongue 14, 15 carry the contacts 20. The contacts 20 may be signal contacts, power contacts, or ground contact in various combinations as desired in accordance with a particular application. Also as illustrated, a middle flange 16 extends from the housing 10 to separate receptacle openings 11, 12. The insulative housing 10 has a mating face 17 for connecting with the plug (not shown) and a mounting face 18 opposite to the PCB 90. The rear section 13 of the insulative housing 10 also defines a recess 19 opens to the mounting face 18 and communicating with an exterior of the insulative housing 10.

Referring to FIGS. 2 and 3, electrical contacts 20 each include a retention section 23 engaging with the insulative housing 10. A contact section 24 extends from one end of the retention section 23 in a direction generally parallel to the tongues 14, 15 and has a convex bend 25 mating with a complementary contact of the mating plug (not shown). The contacts 20 also include a mounting section 26 extending from the other end of the retention section and received in the recess 19 of the insulative housing 10. The mounting section 26 of the electrical contact 20 further includes a soldertail 35 which extends out of the insulative housing 10 for mounting to the PCB 90.

The upper group 21 of the contacts 20 includes four contacts 27, 28, 29, 30 and the lower group 22 also includes four contacts 31, 32, 33, 34. The electrical contacts 27, 31 both transmit power signal and the electrical contacts 30, 34 both transmit ground signal. The electrical contacts 28, 29, 32, 33 are all transmit differential signal wherein the contacts 28, 29, 32, 33 belongs to the same group 21, 22 are transmit the differential pair.

Figure 4:
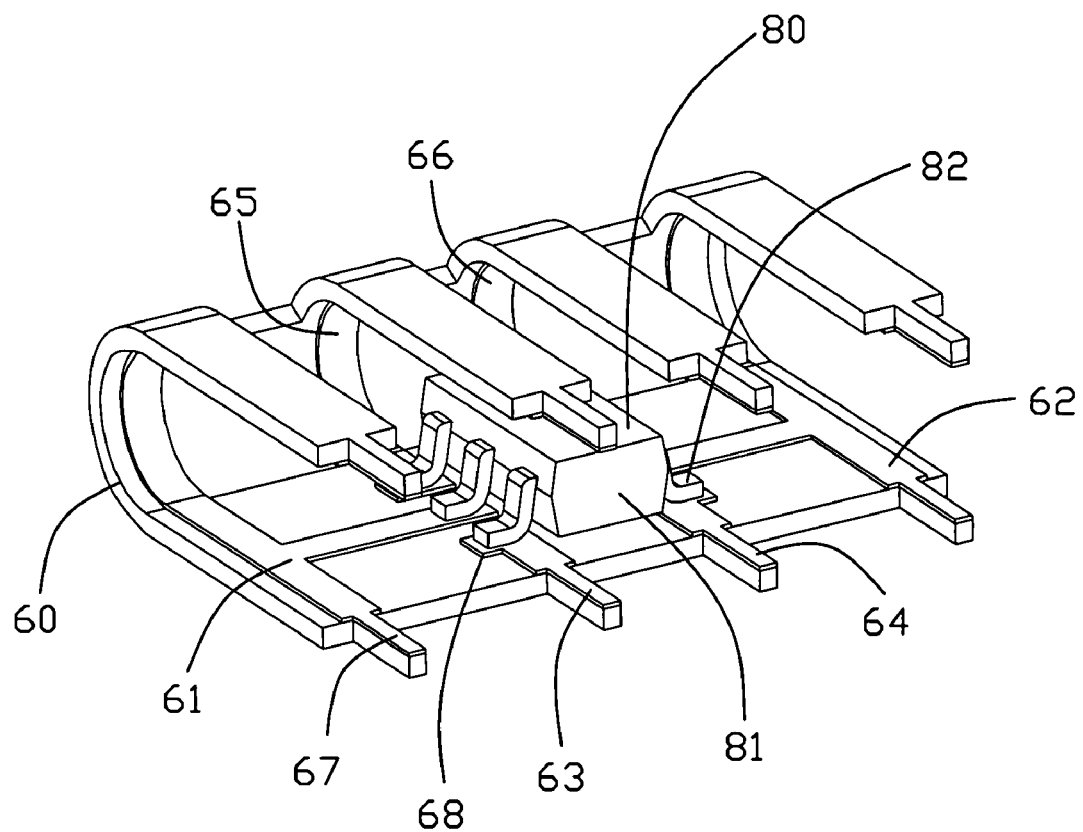
FIG. 4 is a perspective view of the carrier-PCB and the IC of the electrical connector shown in FIG. 2.
Figure 5:
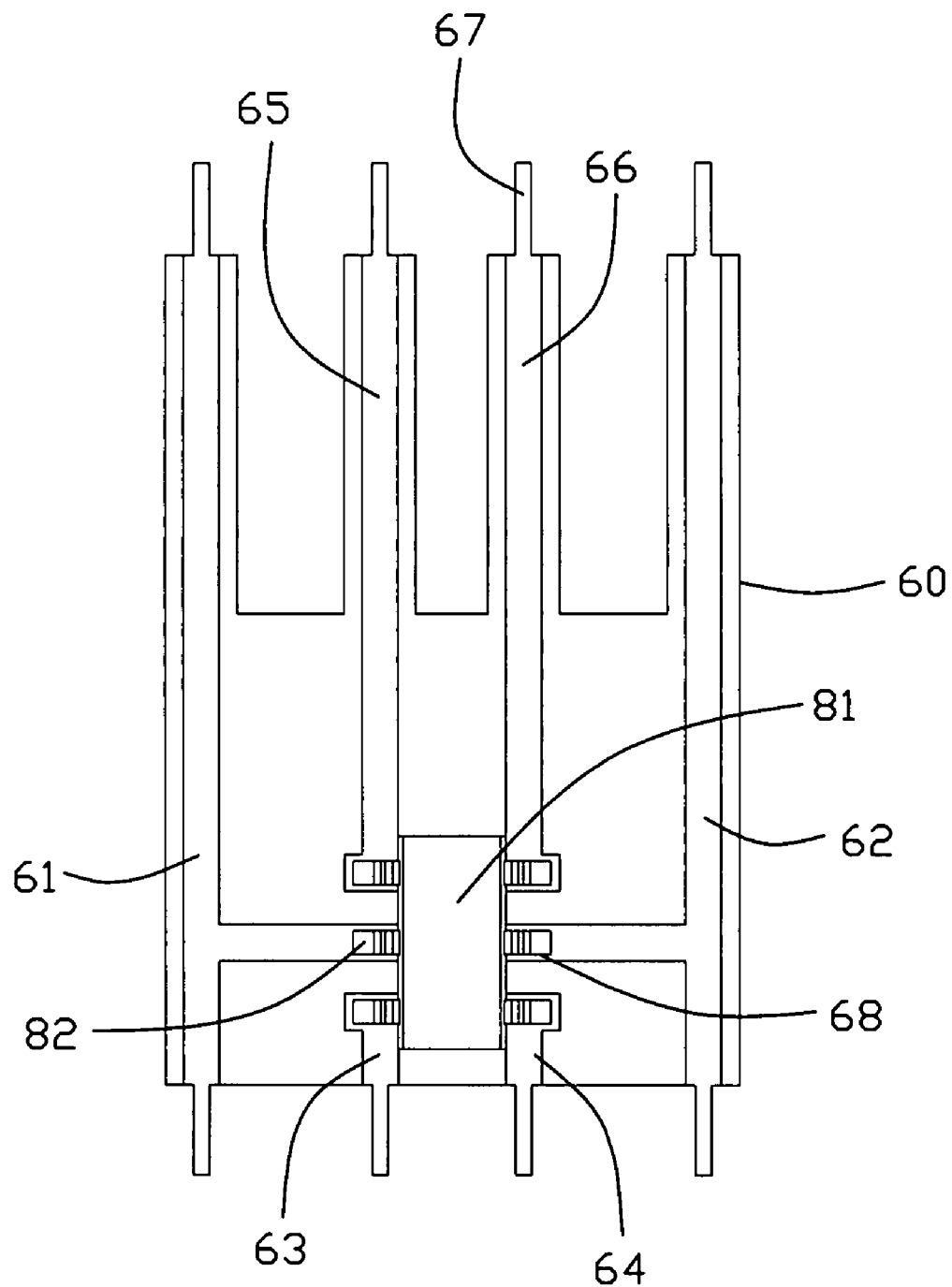
FIG. 5 is an expanded view of the carrier-PCB of FIG. 4 with the IC mounted thereon before attaching to the electrical contacts.

As illustrated in FIGS. 2, 4 and 5, the sub-assembly according to the present invention includes a formed carrier-PCB 60 and an IC 80 mounted thereon. The carrier-PCB 60 is made of formable PCB materials such as Mylar and has a plurality of electrical traces 61, 62, 63, 64, 65, 66 formed thereon. The electrical trace 61 includes two mini soldertails 67 for simultaneously mechanically and electrically connecting with two electrical contacts 27, 31 which belong to different groups 21, 22 and both transmit the same type signal. The electrical trace 62 is similar to the trace 61 which also includes two mini soldertails 67 for connecting with two contacts 30, 34 simultaneously for transmitting the same type signal. The electrical traces 63, 64, 65, 66 each include only one mini soldertail 67 for connecting with the electrical contact 28, 29, 32, 33 respectively, wherein the electrical contacts 28, 29, 32, 33 are transmit the differential signal. Each electrical trace 61, 62, 63, 64, 65, 66 also includes a solder pad 68 for the IC 80.

The IC 80 includes a package 81 with chips (not shown) receive therein and a plurality of lead-frames 82 electrically connected with the chips and extending out of the package 81. The number of the lead-frames 82 is same as the number of the electrical traces 61, 62, 63, 64, 65, 66 so that lead-frames 82 mounted to the solder pads 68, respectively.

FIG. 5 is an expanded view of the sub-assembly and shows the configuration thereof before assembling. The initial state of the carrier-PCB 60 is flat with the IC 80 mounted thereon. During the assembling, the carrier-PCB 60 is formable so that the sub-assembly could be fit within the connector 100. The sub-assembly is inserted into of the insulative housing 10 from the mounting face 18 thereof and in a direction perpendicular to the mounting face 18. The soldertails 35 of the electrical contacts 20 is configured to surround the mini soldertails 67 on the carrier-PCB 60 thereby the sub-assembly is attached to the electrical contacts 20 and received in the recess 19 and between the two groups 21, 22 thereof. Then the electrical connector 100 is soldered to the PCB 90 as shown in FIG. 6. The PCB 90 includes plurality of electrical circuits or traces 91 with solder holes 92 formed thereon. The soldertails 35 are inserted into the solder holes 92 for electrically connecting with the electrical circuits 91.

The electrical contacts 20 mechanically and electrically connected with the carrier-PCB 60 and the PCB 90, which further establish electrical connection between the IC 80 and the PCB 90. The electrical connector 100 bonds the IC 80 therein thereby improving electrical performance and increasing available space on the PCB 90. The PCB 90 does not need to have additional IC for the ESD protection or the like functions. Furthermore, the sub-assembly is mounted to the electrical connector 100 from the mounting face 18 and located between the mounting sections 26 of the two groups 21, 22, which can reduce process time of the electrical connector 100.

It is familiar that a PCB coupon exists in magnetic Ethernet connectors and high speed Backplane connectors. In both cases, the PCB coupon is an integral part of the connector in which their primary function is to provide a signal transmission path. The PCB coupon facilities the majority of the signal path throughout the connector body. But according to the present invention, two different signal transmitting paths can be establish from the mating plug (not shown) to the motherboard 90, one of which is through the electrical contacts 20 directly without passing through the IC, the other is through the contacts 20, the carrier-PCB 60 and the IC 80 in turn. So the electrical contacts 20 and insulative housing 10 can form a connector member as an ordinary connector even if the connector without bonding the sub-assembly and the IC 80 thereon. Therefore, it can be selected whether or not bonding the IC 80 therein according to different requirements.

Figure 7:
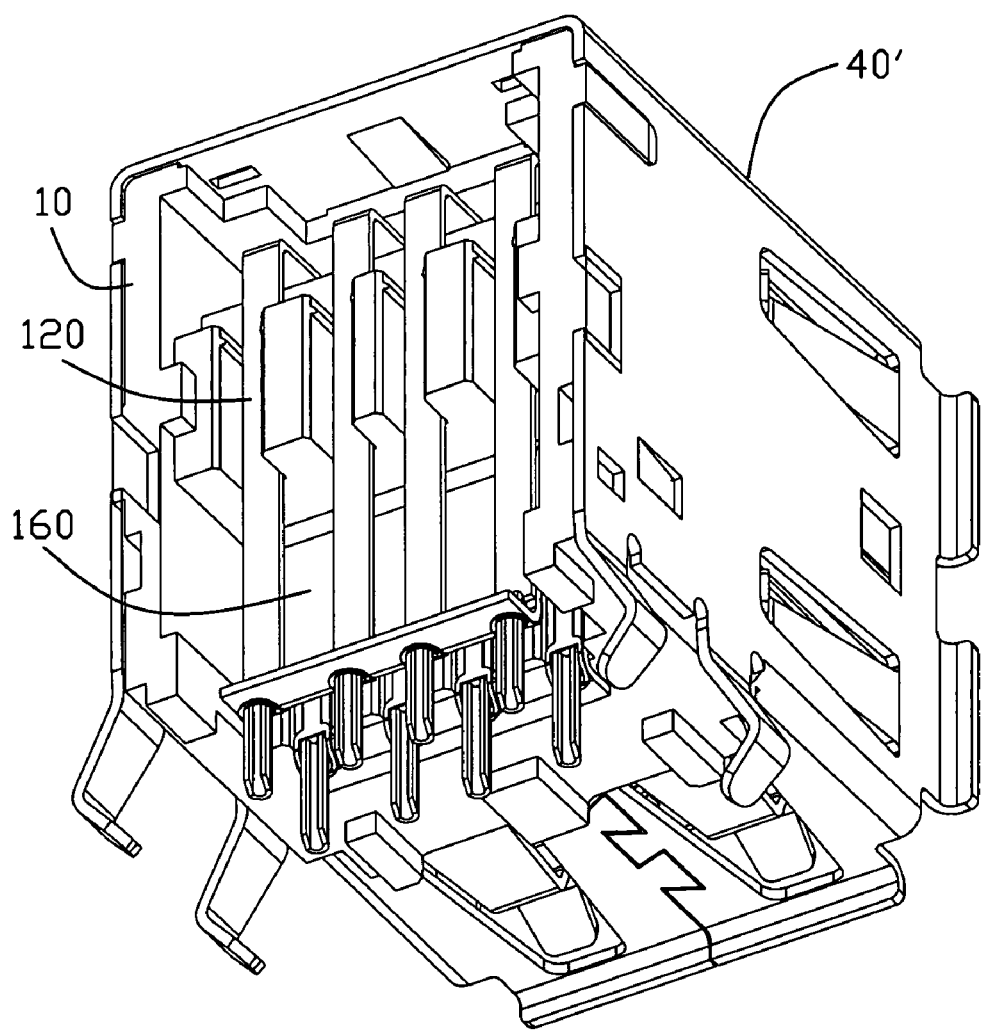
FIG. 7 is a perspective view of an electrical connector according to a second embodiment of the present invention.
Figure 8:
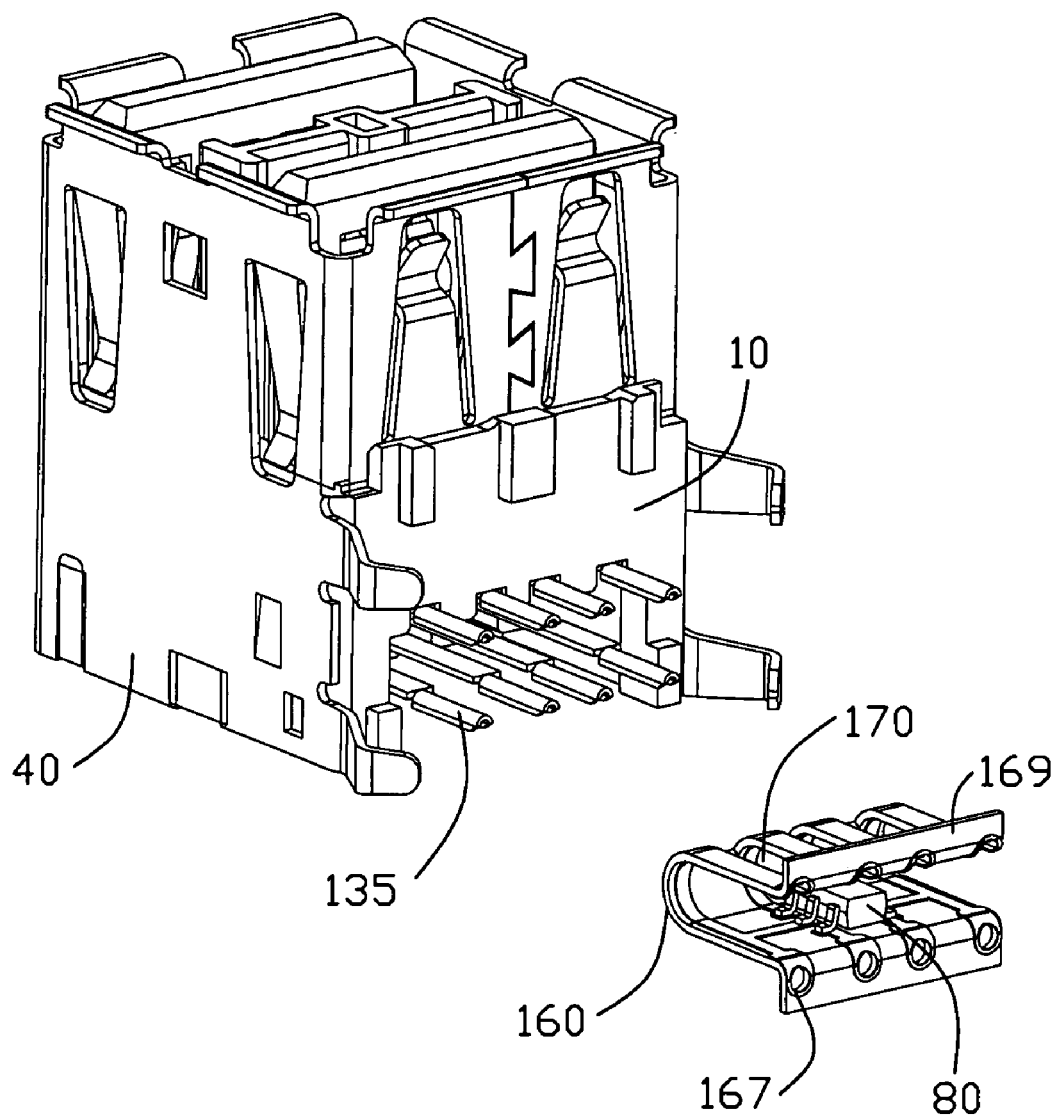
FIG. 8 is an exploded view of the electrical connector shown in FIG. 7.
Figure 9:
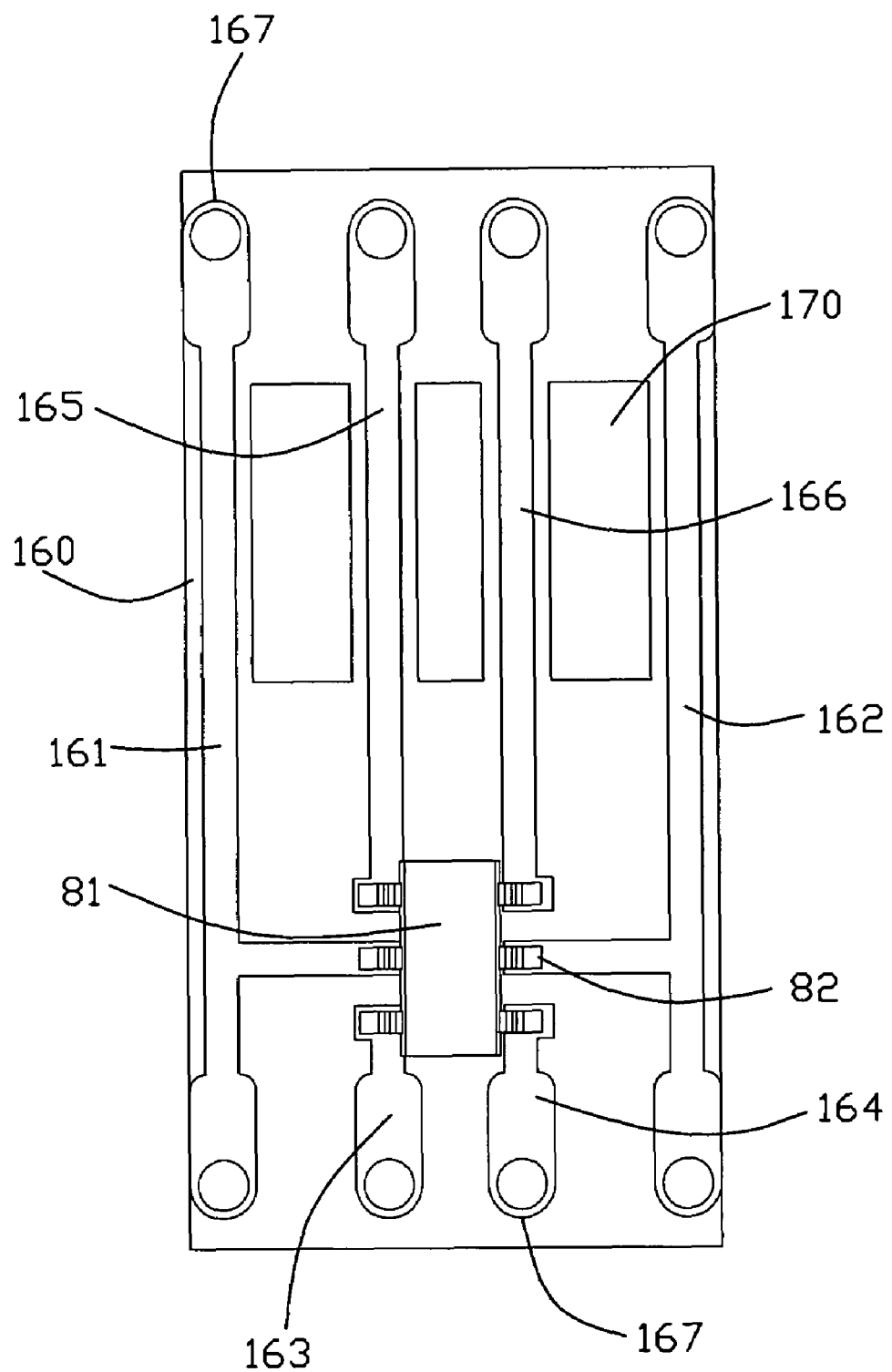
FIG. 9 is an expanded view of the carrier-PCB shown in FIG. 8 with an IC mounted thereon.
Figure 10:
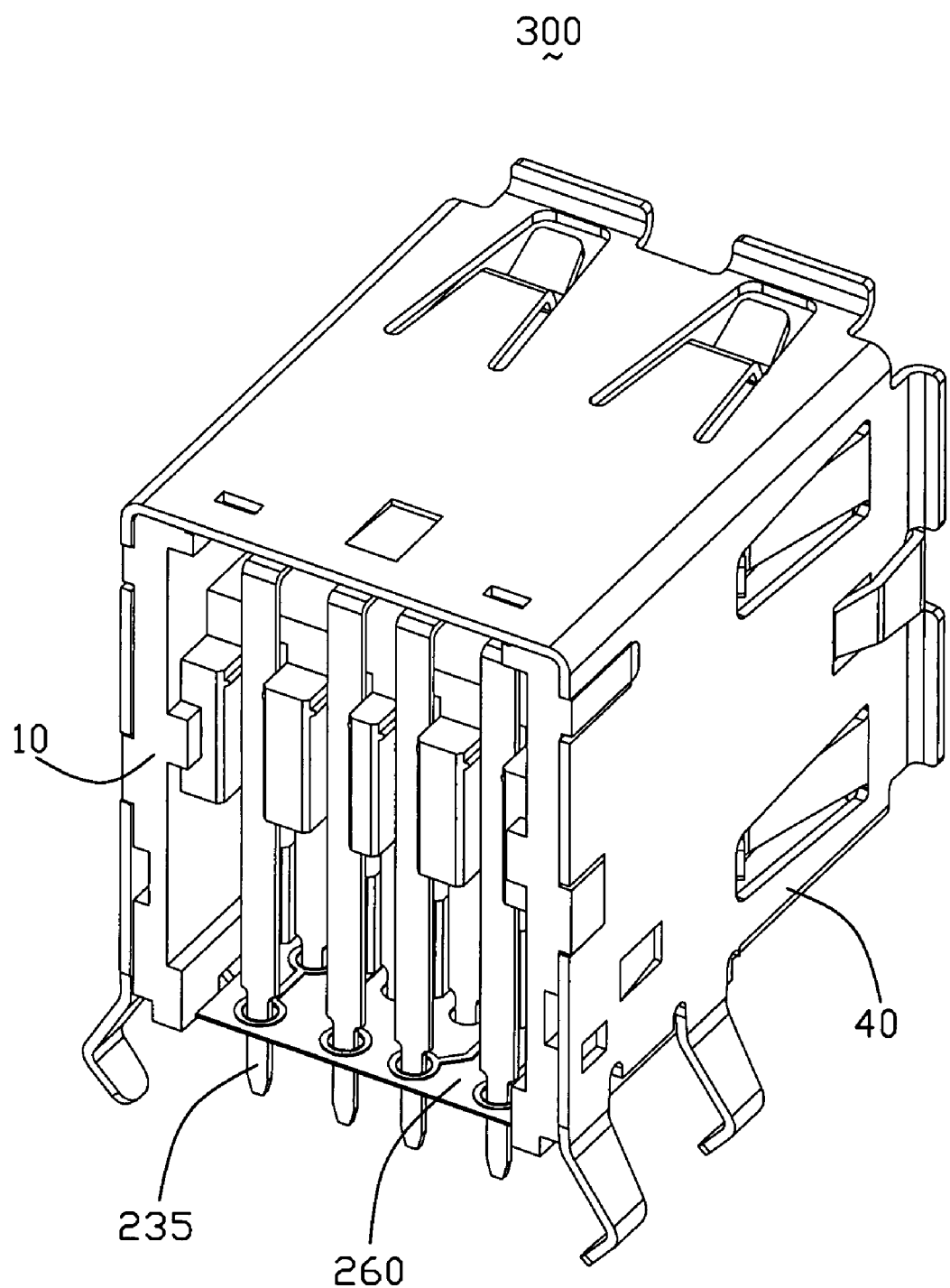
FIG. 10 is a perspective view of an electrical connector according to a third embodiment of the present invention.
Figure 11:
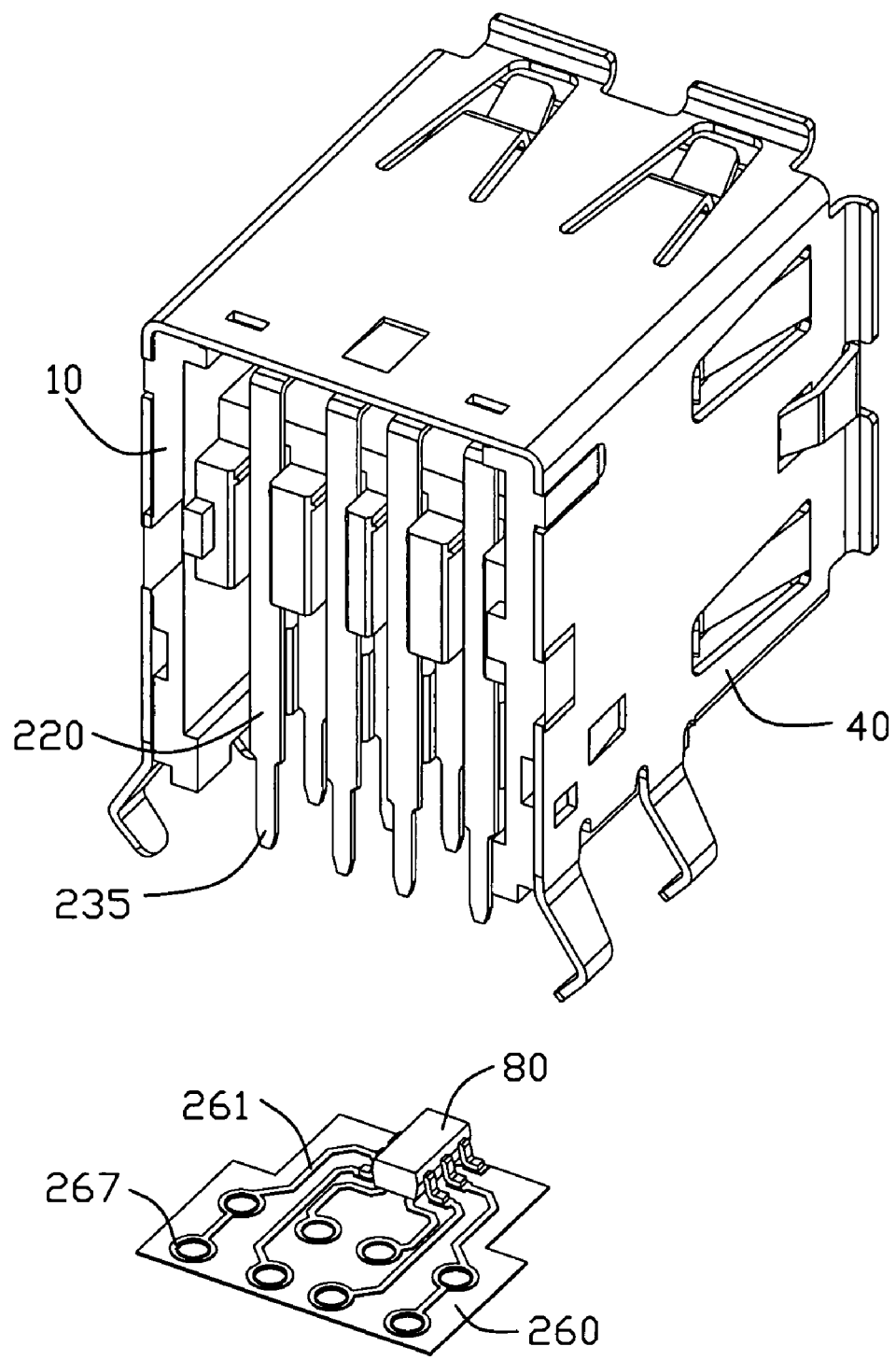
FIG. 11 is an exploded perspective view of the electrical connector shown in FIG. 10.

FIGS. 7 to 9 show a second embodiment according to the present invention. The electrical connector 200 is similar to the electrical connector 100 except the carrier-PCB 160 of the sub-assembly. The electrical traces 161, 162, 163, 164, 165, 166 of the carrier-PCB 160 includes a plurality of eyelets 167 surrounding and connecting with the soldertails 135 which is different from the mini soldertails 67 nested into the soldertails 35 in the electrical connector 100 thereby to establish electrical connection between the IC 80 and the PCB 90 by the electrical contacts 120. The carrier-PCB 160 includes two flangings 169 parallel to the mounting face 18 of the insulative housing 10 for configuring the eyelets 167. A plurality of recesses 170 formed between the electrical traces 161, 165, 166, 162. The carrier-PCB 160 also is formable and the initial state of which please refer FIG. 9. The mini soldertails 67 or the eyelets 167 of the carrier-PCB are placed within the electrical contacts' 20, 120 soldertails 35, 135 pattern and share the same electrical circuits of the PCB 90 with the electrical contacts 20, 120.

Figure 12:
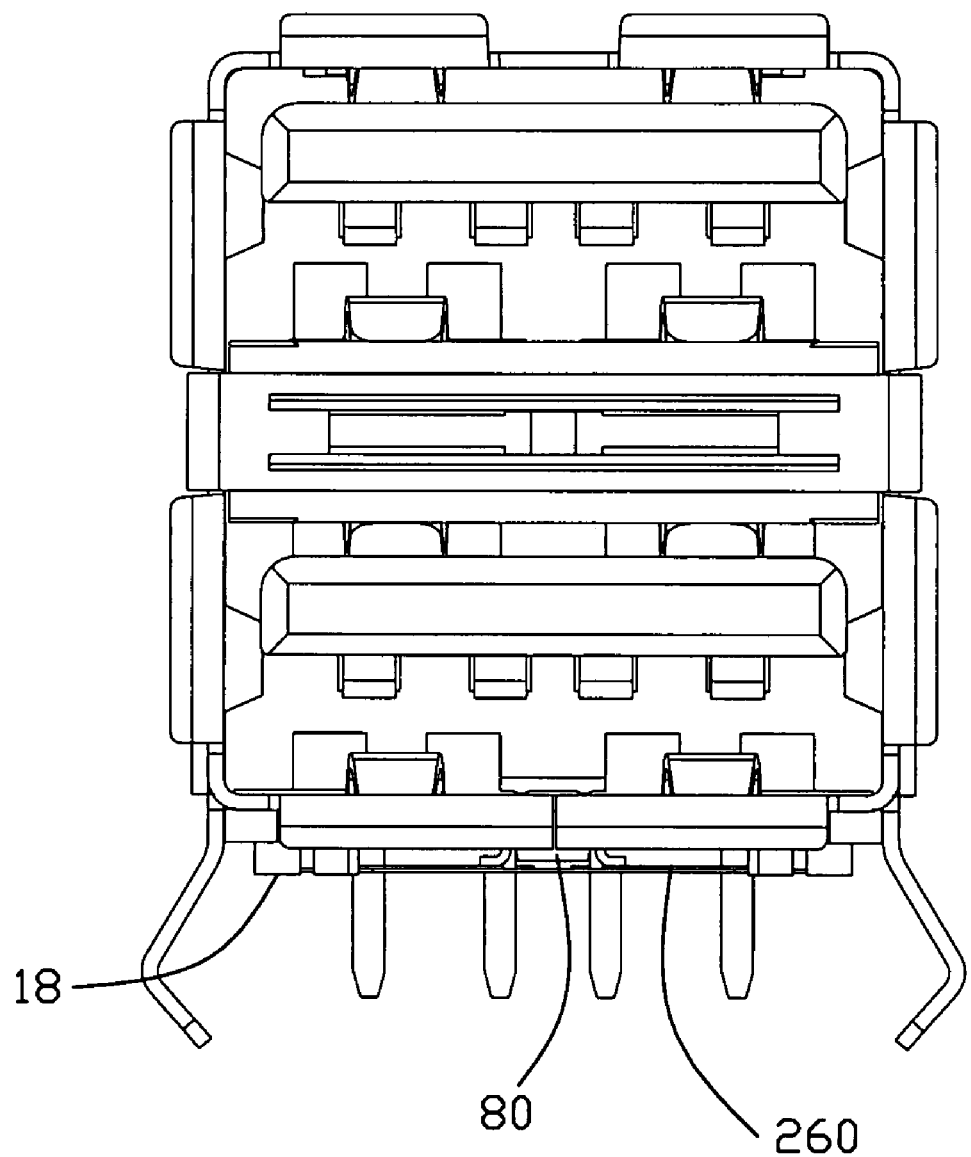
FIG. 12 is a front view of the electrical connector shown in FIG. 11.
Figure 13:
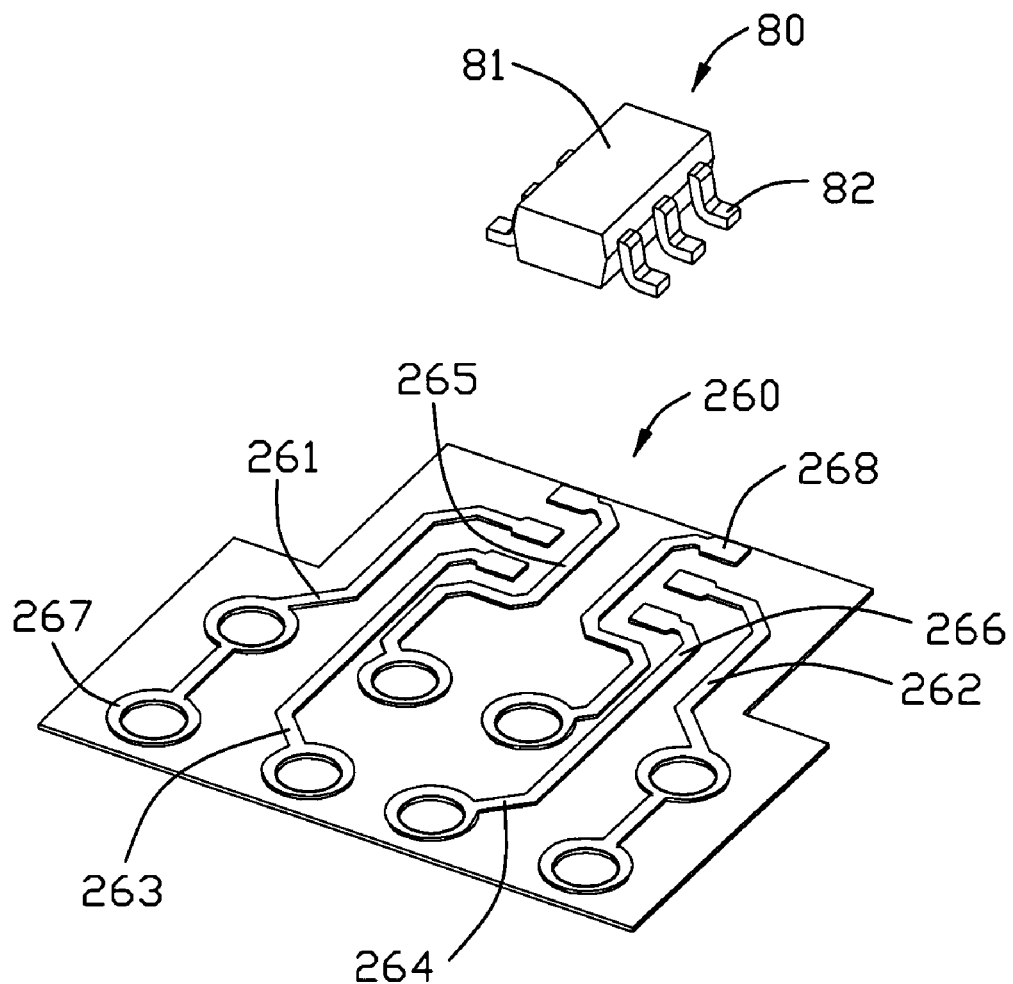
FIG. 13 is an exploded perspective view of the carrier-PCB and the IC shown in FIG. 11.
Figure 14:
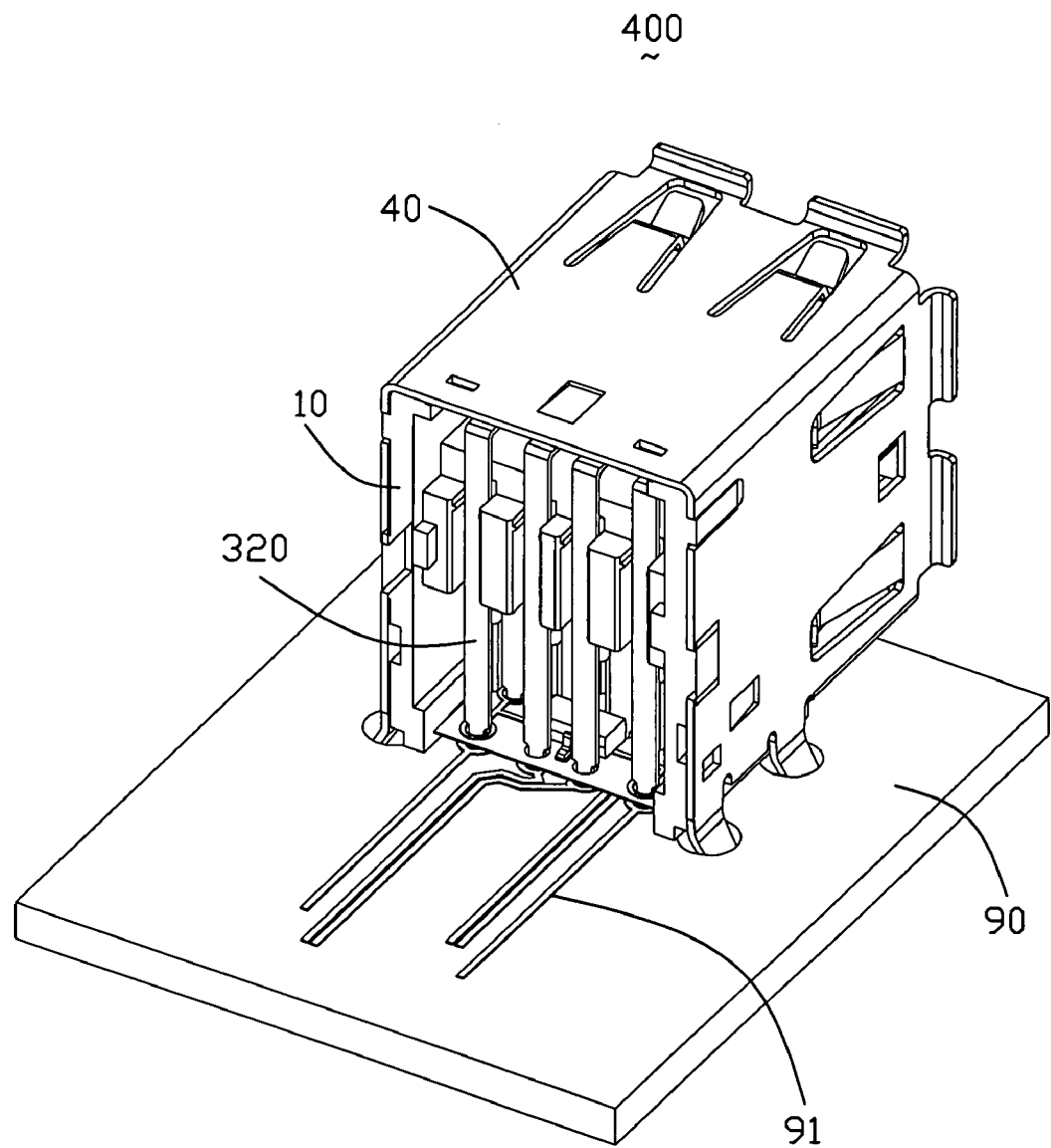
FIG. 14 is a perspective view of an electrical connector according to a fourth embodiment of the present invention, wherein the electrical connector is mounted to the PCB.

FIGS. 10 to 13 show a third embodiment according to the present invention. The electrical connector 300 is similar to the first embodiment except the soldertails 235 of the electrical contacts 220 and the sub-assembly. The sub-assembly includes a rigid, flat carrier-PCB 260 and an IC 80 bonded thereon The carrier-PCB 260 is parallel to the mounting face 18 and includes a plurality of electrical traces 261, 262, 263, 264, 265, 266 formed thereon. Each electrical trace 261, 262, 263, 264, 265, 266 has one or two eyelets 267 for connected with one or two soldertails 235 at a rear edge of the carrier-PCB 260 and a solder pad 268 at a front edge of the carrier-PCB 260 for the IC 80 attached thereto. The sub-assembly is attached to the electrical contacts 220 with the IC 80 positioned before the soldertails 235 along a mating direction of the electrical connector 300. As shown in FIG. 12, after bonding to the electrical connector 300, the carrier-PCB 260 and the IC 80 are above the mounting face 18 of the insulative housing 10.

Figure 15:
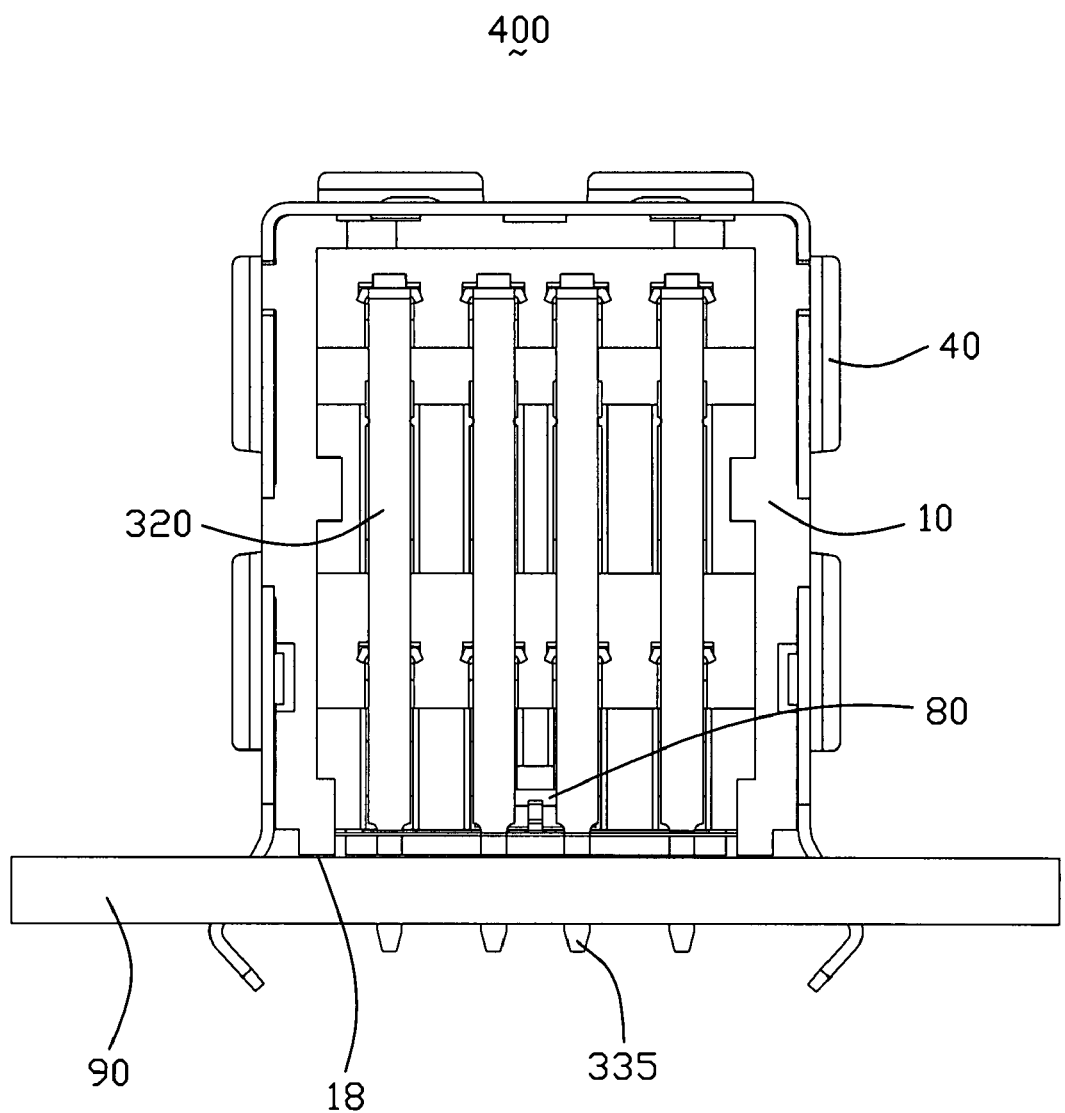
FIG. 15 is a rear view of the electrical connector and the PCB shown in FIG. 14.
Figure 16:
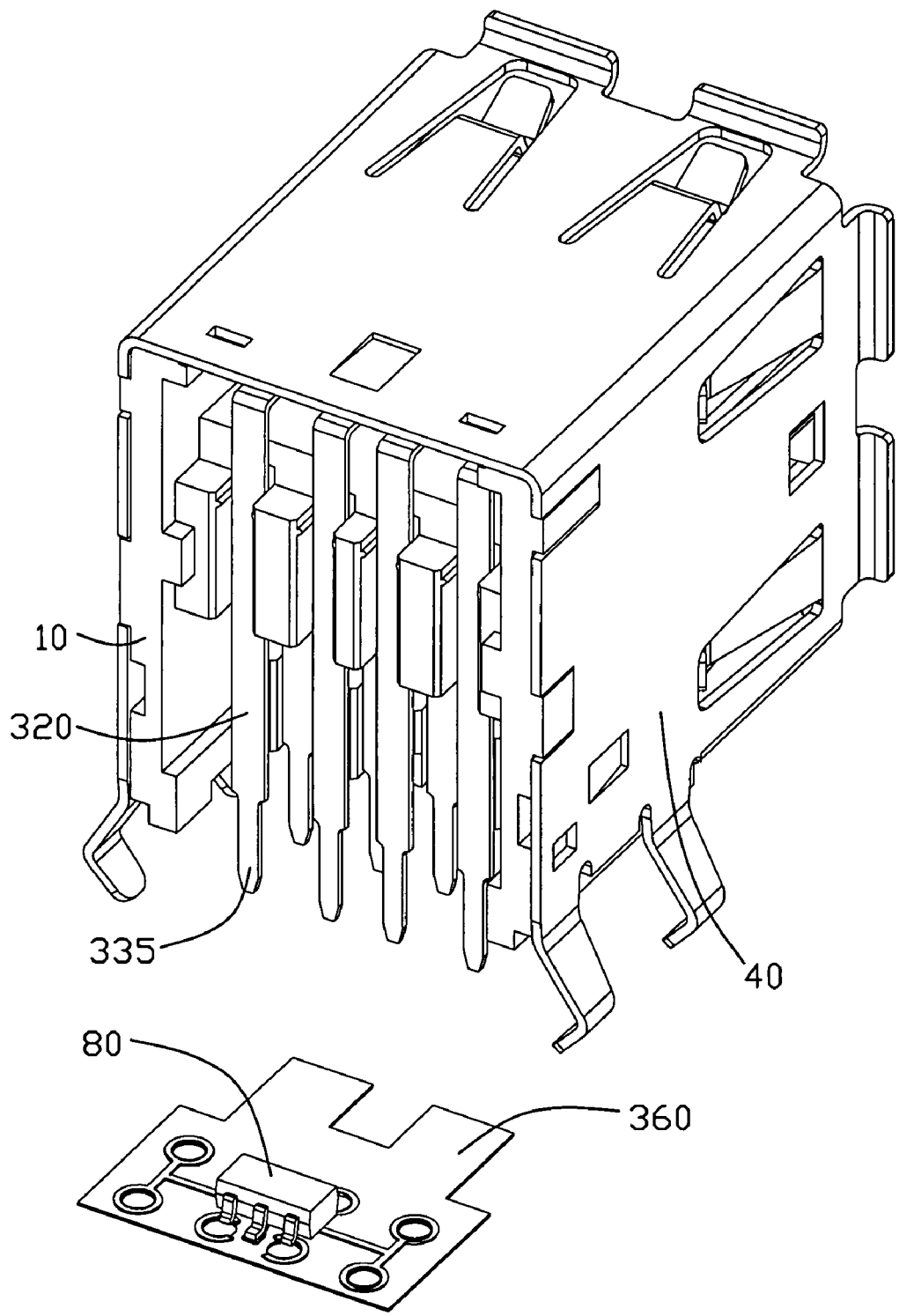
FIG. 16 is an exploded perspective view of the electrical connector shown in FIG. 14.
Figure 17:
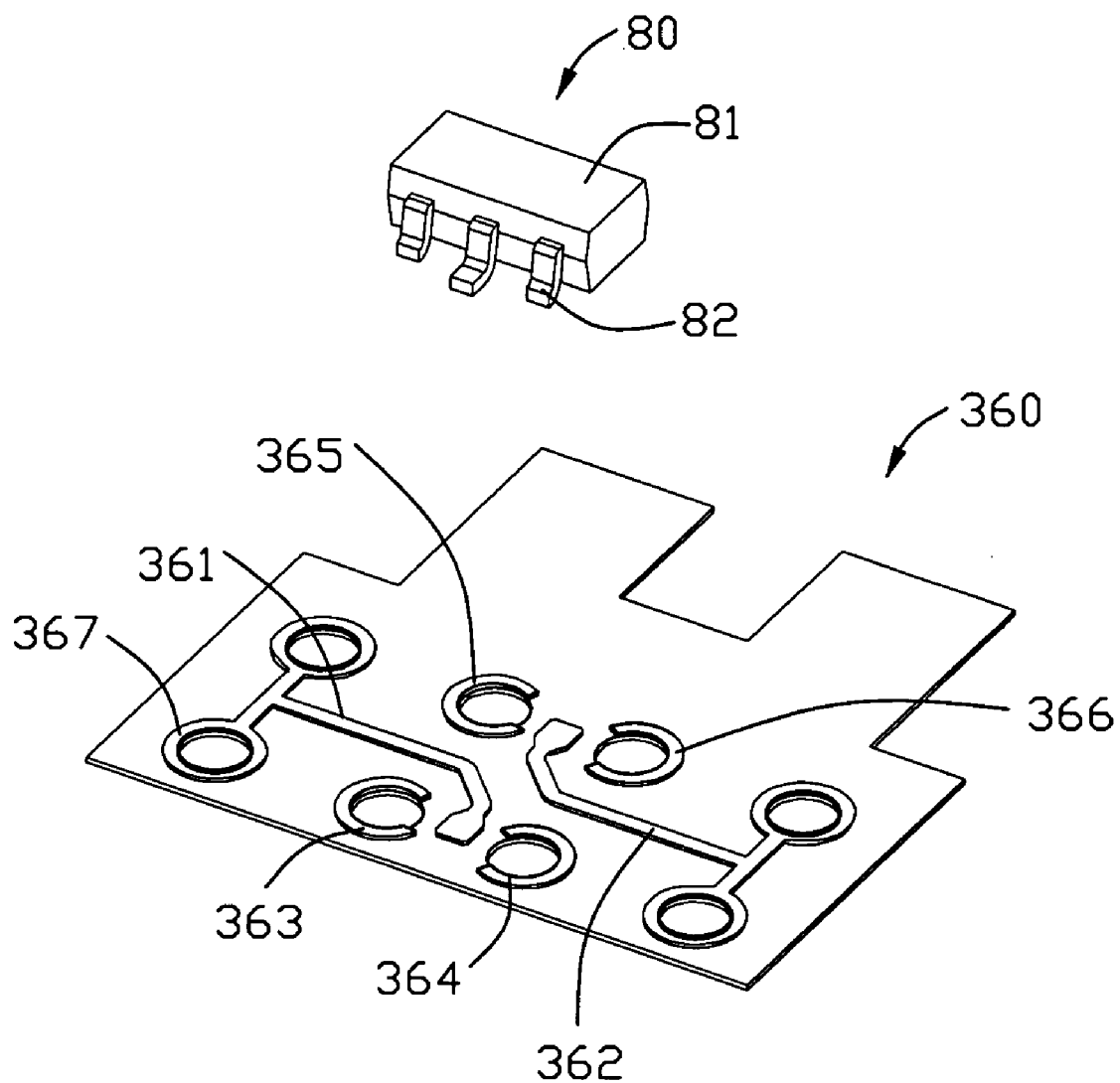
FIG. 17 is an exploded perspective view of the carrier-PCB and the IC shown in FIG. 14.

FIGS. 14 to 17 show a fourth embodiment of the electrical connector 400 which is similar to the third embodiment except the sub-assembly. The carrier-PCB 360 has shortened electrical traces 361, 362, 363, 364, 365, 366 wherein the electrical traces 361, 366 each include two eyelets 367 for connecting with the soldertails 335 and one solder pad 368 for soldering a lead-frame 82 of the IC 80. Each electrical traces 362, 363, 364, 365 is an eyelet and without a solder pad and shorten the length thereof. The electrical traces 362, 363, 364, 365 are simultaneously connected with the soldertails 335 of the electrical contacts 320 and the lead-frames 82 of the IC 80 wherein the IC 80 is located between the electrical traces 361, 362, 363, 364, 365, 366 and the soldertails 335 of the tow groups. As shown in FIG. 15, after bonding to the electrical connector 400, the carrier-PCB 360 and the IC 80 are above the mounting face 18 of the insulative housing 10.

Figure 18:
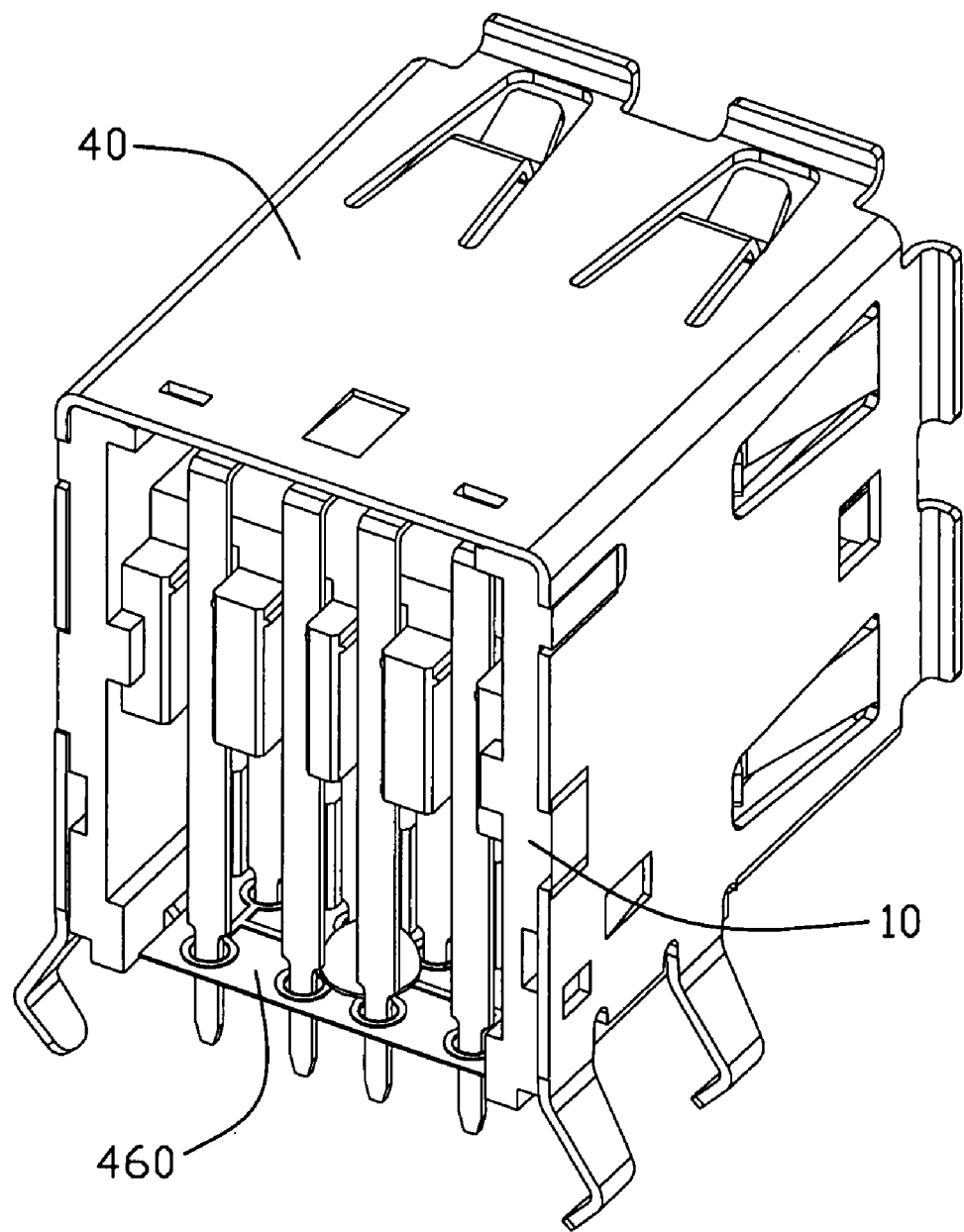
FIG. 18 is a perspective view of an electrical connector according to a fifth embodiment of the present invention.
Figure 19:
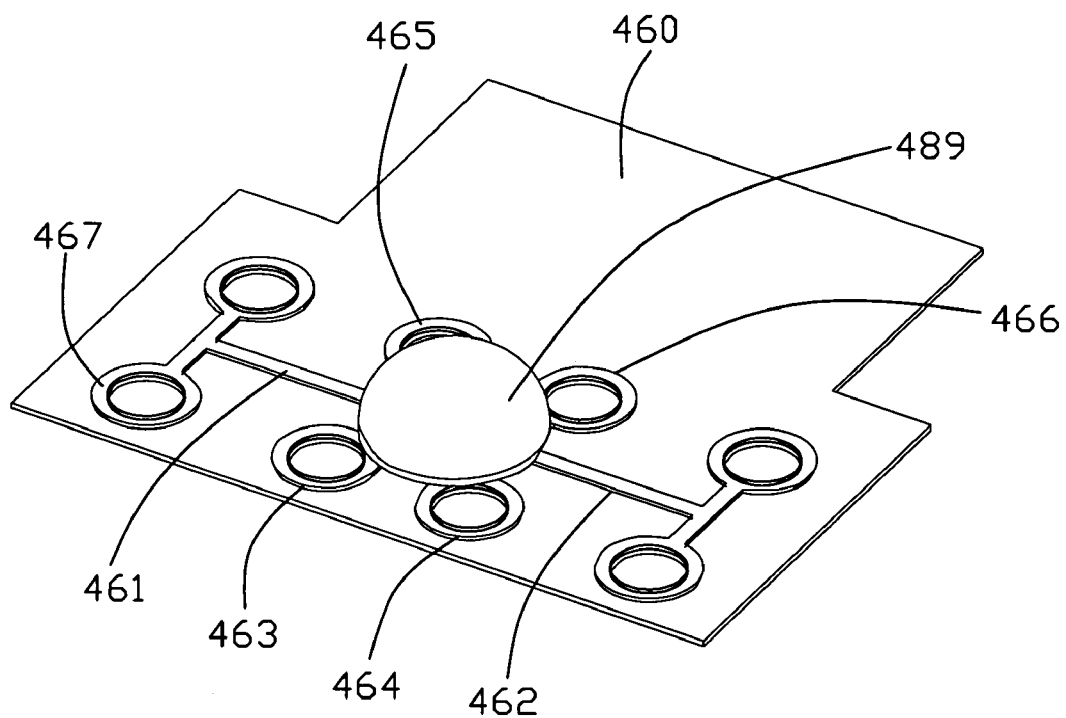
FIG. 19 is an assembled perspective view of the carrier-PCB and the IC shown in FIG. 18, wherein the IC is sealed by a glob-top element.
Figure 20:
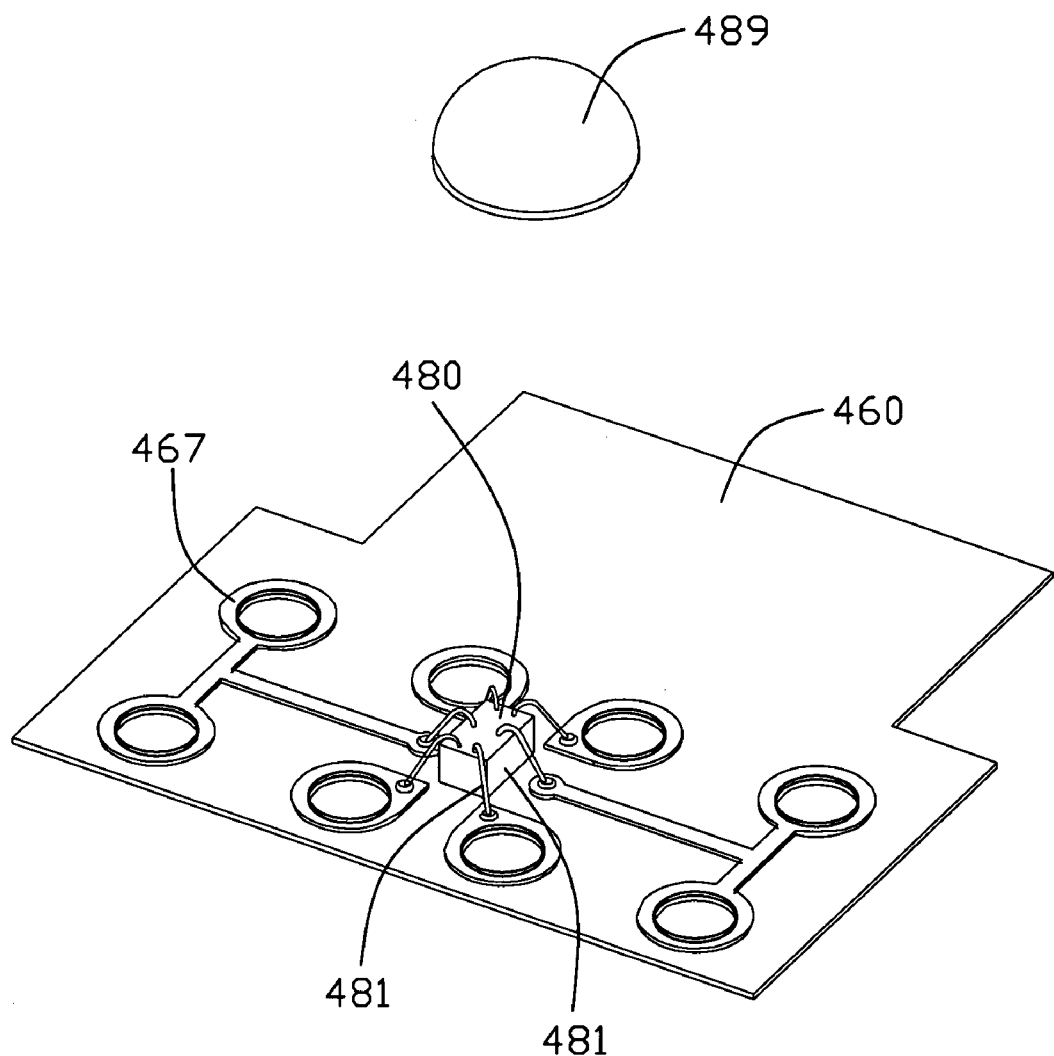
FIG. 20 is a perspective view of the carrier-PCB and the IC shown in FIG. 19, showing the glob-top element detaching from the carrier-PCB.
Figure 21:
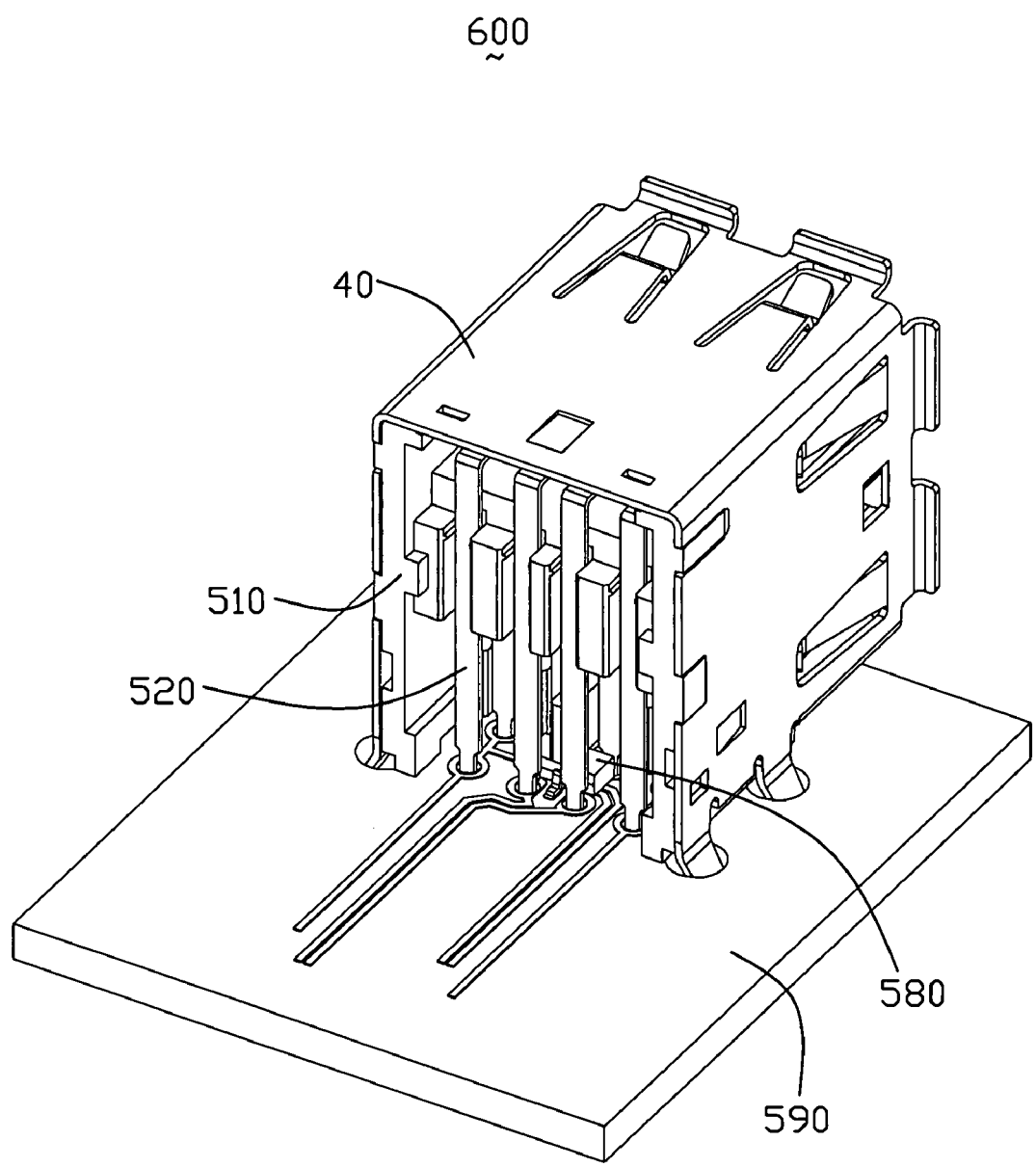
FIG. 21 is a perspective view of an electrical connector according to a sixth embodiment of the present invention, wherein the electrical connector is mounted to a PCB.
Figure 22:
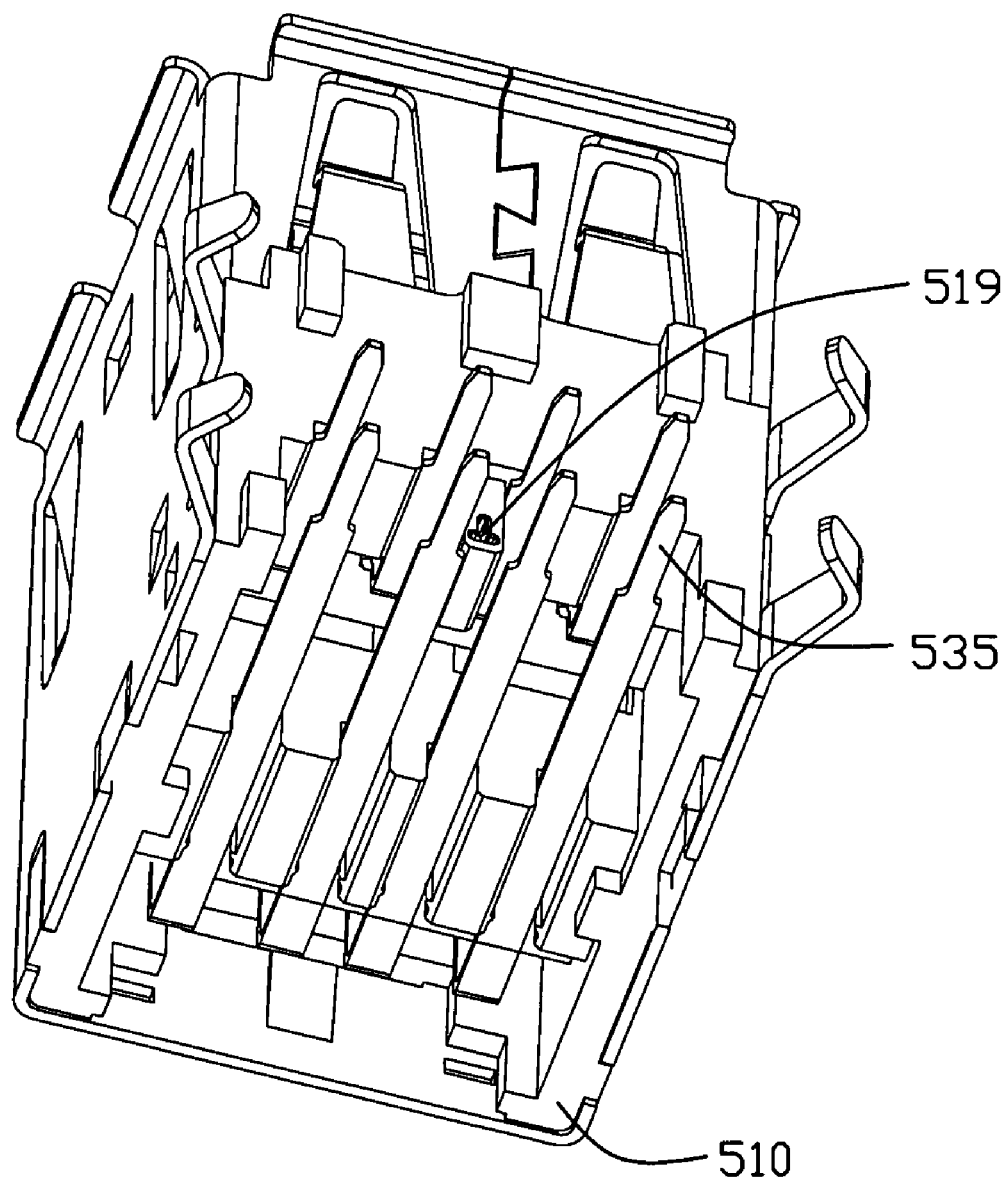
FIG. 22 is an exploded view of the electrical connector shown in FIG. 21, wherein the IC is removed therefrom.
Figure 23:
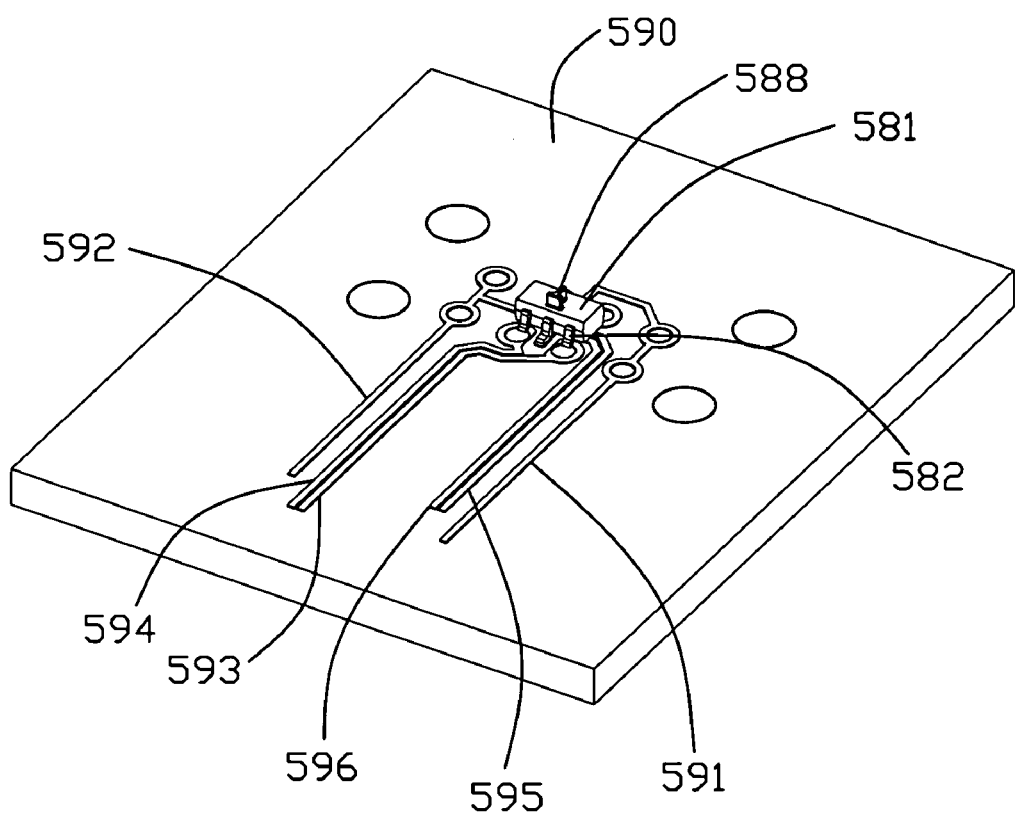
FIG. 23 is a perspective view of the IC and the PCB shown in FIG. 21, illustrating the relationship therebetween.
Figure 24:
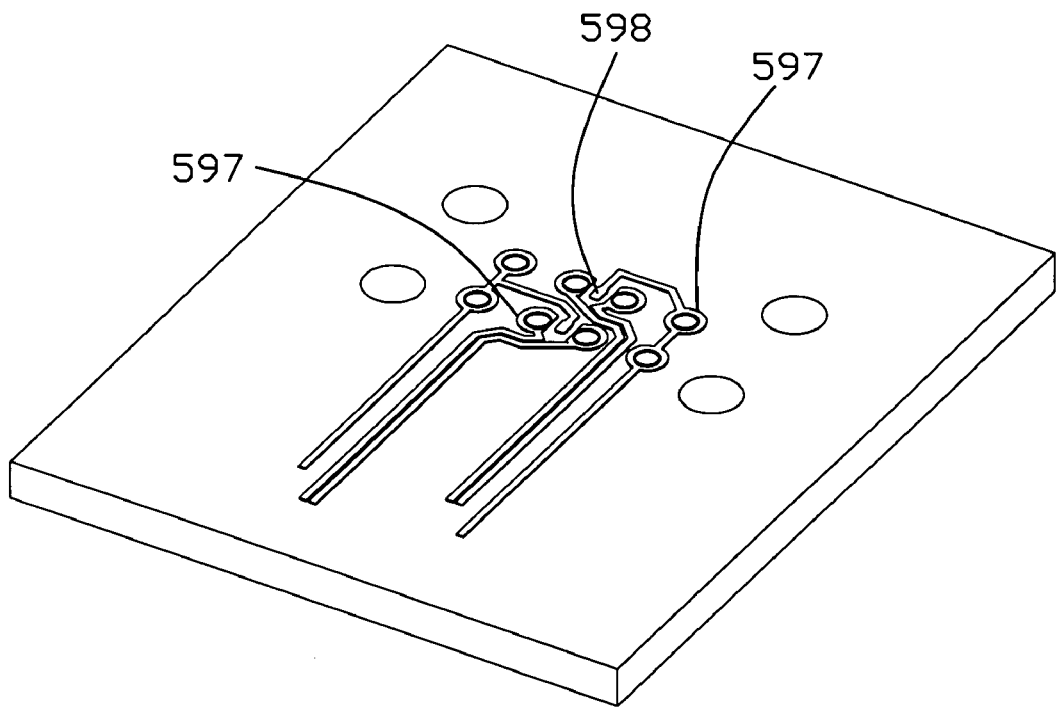
FIG. 24 is a perspective view of the PCB shown in FIG. 21.

Referring to FIGS. 18 to 20, a fifth embodiment according to the present invention is illustrated. An electrical connector 500 is similar to the electrical connector 300 except the IC 480 of the sub-assembly. The IC 480 is an IC die which is eliminated the package 81 and the lead-frames 82 with respect to the IC 80 and mounted to the carrier-PCB 460 directly. The IC die 480 includes a chip 581 and a plurality of bonded wires 481 for connected with the electrical traces 461, 462, 463, 464, 465, 466. The sub-assembly also includes a glob-top element 489 formed by high-temperature encapsulant for sealing the IC die 480 on the carrier-PCB 460.

FIGS. 21 to 24 show a sixth embodiment of the electrical connector 600. The IC 580 is press fit into the insulative housing 510 directly with a T-shape lug 588 molded thereon. The housing 510 includes a T-shape recess 519 for received the lug 588 therein. The IC 580 includes a package 581 and a plurality of lead-frames 582. The PCB 590 which the electrical connector 500 mounted thereto is also different from the PCB 90 with a plurality of electrical circuits 591, 592, 593, 594, 595, 596 formed thereon. The electrical circuits 591, 592 each include two eyelets 597 for the soldertails 535 inserted therein and one solder pad 598 for one of the lead-frames 582 of the IC 580. The electrical circuits 593, 594, 595, 596 each include an eyelets 597 and simultaneously connect with the soldertails 335 and the remaining lead-frames 582 of the IC 580 wherein the IC 580 is located between the solder holes 597 and the soldertails 535.

The lead-frames 582 of the IC 580 and the soldertails 535 share the same electrical circuits of the PCB 590. Two signal transmitting paths can be establish from the mating plug (not shown) to the motherboard 590, one is through the electrical contacts 520 directly without passing through the IC, the other is through the contacts 520 and the IC 580, so the electrical contacts 520 and insulative housing 510 can form a connector member as a usual connector without the IC 580. Therefore, the manufacturers of the motherboard can be selected whether or not bonding the IC 580.

It should be noted that the IC according to the present invention could be any electrical device or component which is typically installed on a PCB. The IC, the electrical contacts and the insulative housing are combining into a single unit to mount to the PCB simultaneously. The IC is corresponding to all of the electrical contacts thereby each contacts is electrical connected with of the IC.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector for mounting to a PCB which includes a plurality of electrical circuits, comprising:

a connector member comprising an insulative housing and a plurality of integrated electrical contacts attached to the insulative housing, the insulative housing having a mating face and a mounting face, each electrical contact including a retention section engaging with the insulative housing, a mating section extending from one end of the retention section to the mating face, and a mounting section extending from the other end of the retention section to the mounting face and out of the insulative housing;

an IC bonded to the connector member and combining with the connector member into a single unit, and wherein the electrical contacts are electrically connected to the printed circuit board and the IC; and a carrier-PCB attached to the connector member from the mounting face including a plurality of electrical traces; and wherein the IC is attached to the carrier-PCB;

wherein the carrier-PCB is form-able to fit to the electrical contacts after the IC attaching to the carrier-PCB, and the carrier-PCB bonded to the connector member along a direction perpendicular to the PCB;

wherein the mounting portion of the electrical contact includes a soldertail connecting with the electrical circuits of the PCB.

2. The electrical connector as claimed in claim 1, wherein the IC includes a package and a plurality of lead-frames extending out of the package, and wherein the lead-frames are mechanically and electrically connected with the electrical traces of the carrier-PCB.

3. The electrical connector as claimed in claim 1, wherein the carrier-PCB includes a plurality of mini soldertails being nested within the soldertails of the electrical contacts.

4. The electrical connector as claimed in claim 1, wherein the carrier-PCB includes a plurality of solder eyelets corresponding to the electrical contacts, and wherein the soldertails of the electrical contacts extends through the eyelets, respectively.

5. An electrical connector assembly comprising:
a printed circuit board;
a connector member mounted upon the printed circuit board and comprising an insulative housing and a plurality of electrical contacts categorized with different first and second groups each having four said contacts extending into two different receptacle openings in the housing for respectively mating different complementary connectors and attached to the insulative housing, the insulative housing having a mating face and a mounting face, each electrical contact including a retention section engaging with the insulative housing, a mating section extending from the retention section to the mating face, and a mounting section extending from the retention section to the mounting face; and an IC including thereof six lead-frames arranged in two rows each having three said lead-frames thereof, wherein one said lead-frame in each row is electrically connected to both one corresponding contact in the first group and another corresponding contact in the second group, both of which transmits a same signal, while each of said other two lead-frames in said each row being electrically connected to only one corresponding contact.

6. The electrical connector assembly as claimed in claim 5, wherein said IC is associated with the connector member rather than with the printed circuit board.

7. The electrical connector assembly as claimed in claim 5, wherein said other two lead-frames in each row of the IC are electrically connected to the corresponding contacts in the same group rather than in the different first and second groups respectively.

8. An electrical connector for transmitting signals between a PCB which includes a plurality of electrical circuits and a mating plug, comprising:

an insulative housing including a mating face and a mounting face;

a plurality of electrical contacts each comprising a retention section engaging with the insulative housing, a mating portion extending from one end of the retention section to the mating face, and a mounting portion extending from the other end of the retention section to the mounting face and attached to the PCB; and an IC integrate to the connector, the IC and the electrical contacts soldering to the PCB simultaneously and sharing the same electrical traces on the PCB, wherein two different signal transmitting paths are established between the mating plug and the PCB, and wherein the first path is through the electrical contacts directly, and the second path is through the electrical contacts and the IC; wherein the mounting portions extends out of the insulative housing and mounted to the PCB at the mounting face.

9. The electrical connector as claimed in claim 8, wherein the IC is integrated to the connector by a carrier-PCB, and wherein the carrier-PCB is attached to the electrical contacts and connected therewith, and the second path further including the carrier-PCB between the electrical contact and the IC.

* * * * *